(12) United States Patent
Partee et al.

(10) Patent No.: US 6,720,620 B1
(45) Date of Patent: Apr. 13, 2004

(54) MATERIAL AND METHOD FOR MANUFACTURING SEMICONDUCTOR ON INSULATOR SUBSTRATES AND DEVICES

(75) Inventors: Charles Partee, Lyons, CO (US); Scott Joray, Superior, CO (US)

(73) Assignee: Cenymer Corporation, Longmont, CO (US)

(*) Notice: Subject to any disclaimer, the term of this patent is extended or adjusted under 35 U.S.C. 154(b) by 0 days.

(21) Appl. No.: 10/413,127

(22) Filed: Apr. 14, 2003

Related U.S. Application Data

(60) Provisional application No. 60/372,239, filed on Apr. 12, 2002.

(51) Int. Cl.[7] ............................................. H01L 31/0392
(52) U.S. Cl. ........................ 257/347; 257/705; 438/149; 438/778; 438/780
(58) Field of Search ................................. 257/347, 705; 438/149, 311, 778, 780, 781, 787

(56) References Cited

U.S. PATENT DOCUMENTS

| 5,185,286 A | 2/1993 | Eguchi |
| 5,321,298 A | 6/1994 | Moslehi |
| 5,516,884 A | 5/1996 | Bianconi |
| 6,239,469 B1 | 5/2001 | Bolam et al. |

OTHER PUBLICATIONS

SOI Technology: IBM's Next Advance In Chip Design, 10 pgs.

Primary Examiner—Sara Crane
(74) Attorney, Agent, or Firm—William F. Lang, IV; Eckert Seamans Cherin & Mellott, LLC

(57) ABSTRACT

A semiconductor device is formed from a semiconductor on insulator substrate, with the insulator or dielectric layer being formed from a polymer precursor to ceramic. The polymer precursor to ceramic may be SiC, diamond, or diamond-like carbon. The resulting device has improved thermal properties, smoothness, dielectric properties, ease of processing, and performance. A method of making the semiconductor device is also disclosed.

64 Claims, 3 Drawing Sheets

MATERIAL AND METHOD FOR MANUFACTURING SEMICONDUCTOR ON INSULATOR SUBSTRATES AND DEVICES

CROSS REFERENCE TO RELATED APPLICATION

This application claims priority under 35 USC §119 to U.S. provisional application Ser. No. 60/372,239, filed Apr. 12, 2002, entitled "Semiconductor on Insulator Substrates with Improved Properties and Method for Manufacturing Same."

BACKGROUND OF THE INVENTION

I. Field of the Invention

The present invention relates to the field of semiconductor on insulator technology. More particularly, the present invention relates to semiconductor devices having an insulator layer with improved thermal conductivity, made from a polymer precursor to ceramic, and a method of making the same.

II. Description of the Related Art

The microelectronics industry, such as the semiconductor device industry, is driven by market demands to increase continually the speed, bandwidth, and performance of its devices. Generally, it is also advantageous to reduce the size of the devices while maintaining or improving performance and speed. Driven by and reflecting this demand, the clock speed, for example, of microprocessors is increasing every year as reflected by the aphorism commonly known as Moore's Law. One of the critical problems in the continued advancement of microelectronics is the capacitance of the transistors and other design components in the chip. Semiconductor on insulator (SOI), such as silicon on insulator, technology offers the advantage over conventional bulk semiconductor technology of reducing the area junction capacitance of the device. This decrease in capacitance leads to higher possible speeds for a given device. A typical estimate is that the silicon on insulator technology using $SiO_2$ as the insulator offers a performance improvement between 20 and 35% over bulk silicon (SOI technology for the GHz era, IBM research journal, Shahadi). Devices with lower junction capacitance can also require less power. Higher speed is required to continue advancing the technological capabilities of electronics; lower power consumption is a critical need for portable electronics.

Turning to the prior art of silicon on insulator, one well-known method is to bond two silicon wafers, one or both having an oxide layer, together using a high-temperature fusion process. Using chemo-mechanical lapping or a slicing technique, one of the silicon wafers is then nearly lapped or sliced completely away to form a silicon on oxide layer. This method produces an entire wafer of silicon on insulator.

Another method is SIMOX (Separation by Implanted Oxygen) technology. In this case, the surface of the wafer is implanted with oxygen to a fixed depth and then the wafer is annealed in order to bury the oxygen. Recent advancements in control of the SIMOX step have led to this approach being successfully commercialized. This method produces an entire wafer of silicon on insulator.

Other methods, such as U.S. Pat. No. 5,185,286 to Eguchi, U.S. Pat. No. 5,321,298 to Moslehi, and U.S. Pat. No. 6,239,469 to Bolam, allow for forming regions of silicon on insulator.

The disadvantage of each of these approaches is that the insulator is either an oxide or a nitride. Typically, these layers are also good thermal insulators. Generally, it is well-known that microelectronic components work better and more reliably at lower temperature, therefore an insulating layer that also conducts heat well would be a benefit. The present invention is directed toward a method of fabricating the insulator layer from a ceramic material with high thermal conductivity and high electrical resistivity.

Polymer precursors to ceramic are described generally in U.S. Pat. No. 5,516,884 to Bianconi. Bianconi discloses a broad range of polymer precursors to ceramic, method of manufacturing these substances and suggests some possible uses. The present invention is directed towards the use of specific, improved polymer precursors to ceramic as the insulator layer of a silicon-on-insulator semiconductor substrate. Specifically, Bianconi implies that it is desirable to minimize or eliminate the halogens from the final compound during formation of the PPTC, while the present inventors have discovered that the presence of such halogens in general, and chlorine in particular, is advantageous when the PPTC is used as the insulator layer of a silicon on insulator substrate.

SUMMARY OF THE INVENTION

Accordingly, the present invention solves the above needs through the use of a polymer precursor to ceramic. Unlike the conventional insulating material for silicon on insulator devices and wafers, a polymer precursor to ceramic can be easily applied and converted to ceramic to serve as the insulating layer in a semiconductor on insulator substrate, providing the desired properties of high thermal conductivity and low area junction capacitance.

In a preferred embodiment, the polymer precursors to ceramic have the chemical formula $[CR]_n$, more fully defined below. Preferred embodiments may further have the formula $(CH)_n(X)_m$, described below. These polymer precursors to ceramic, when converted to ceramic, offer a layer which is an electrical insulator while having increased thermal conductivity.

The polymer is applied to the device using a variety of methods appropriate for the application of fluids to a surface, such as dispensing on a spinning substrate akin to a typical photoresist dispensation. Other suitable methods include spraying, dipping, or wiping. After conversion to ceramic, the polymer can be processed to provide exceptional surface smoothness, with or without subsequent polishing operations.

When applied to the method for making semiconductor on insulator devices, such as silicon on insulator devices, the electrical resistivity of the ceramic beneath the device decreases the area junction capacitance, thus allowing for increased speeds over the bulk semiconductor, similar to the same method using SiO2, and allows for increased thermal transfer through the ceramic layer. By helping to wick away the heat generated by the device, the ceramic layer allows for higher power levels or for cooler operation. Cooler operation will extend the life of the device and reduce temperature related variations in its performance. Higher power levels allow devices to switch more power or to run faster or both.

It is therefore an object of the invention is to provide a method for forming a semiconductor on insulator structure across an entire wafer using a polymer precursor to a ceramic, such as SiC or Diamond, as the insulator layer.

Another object of the invention is to provide a method for forming a semiconductor on insulator structure across an entire wafer using a polymer precursor to a ceramic, such as SiC or Diamond, as the insulator layer that provides a smooth surface for the subsequent growth of the semiconductor layer.

A further object of the invention is to provide a method for forming a semiconductor on insulator structure across an entire wafer using a polymer precursor to ceramic, such as SiC or Diamond, as the insulator layer that provides a more thermally conductive layer to improve heat conduction away from the device.

Another object of the invention is to provide a method for forming a semiconductor on insulator structure across an entire wafer using a polymer precursor to a ceramic that provides a lower capacitance between the device and the substrate.

A further object of the invention is to provide a method for forming a semiconductor on insulator structure across an entire wafer using a polymer precursor to an amorphous material, such as amorphous diamond-like carbon, as the insulator layer to prevent lattice mismatch between the insulator and the semiconductor layer.

Another object of the invention is to provide a method for forming a semiconductor on insulator structure on a region of a wafer.

A further object of the invention is to provide a method for forming a semiconductor on insulator structure on a region of a wafer using a polymer precursor to a ceramic, such as SIC or Diamond, as the insulator layer that provides a smooth surface for the subsequent growth of the semiconductor layer.

Another object of the invention is to provide a method for forming a semiconductor on insulator structure on a region of a wafer using a polymer precursor to ceramic, such as SiC or Diamond, as the insulator layer that provides a more thermally conductive layer to improve heat conduction away from the device.

A further object of the invention is to provide a method for forming a semiconductor on insulator structure on a region of a wafer using a polymer precursor to a ceramic that provides a lower capacitance between the device and the substrate.

Another object of the invention is to provide a method for forming a semiconductor on insulator structure on a region of a wafer using a polymer precursor to an amorphous material, such as amorphous diamond-like carbon, as the insulator layer to prevent lattice mismatch between the insulator and the semiconductor layer.

These and other aspects of this invention will become apparent through the following description and drawings.

BRIEF DESCRIPTION OF THE DRAWINGS

Like reference characters denote like elements throughout the drawings.

DETAILED DESCRIPTION

Figure 1:
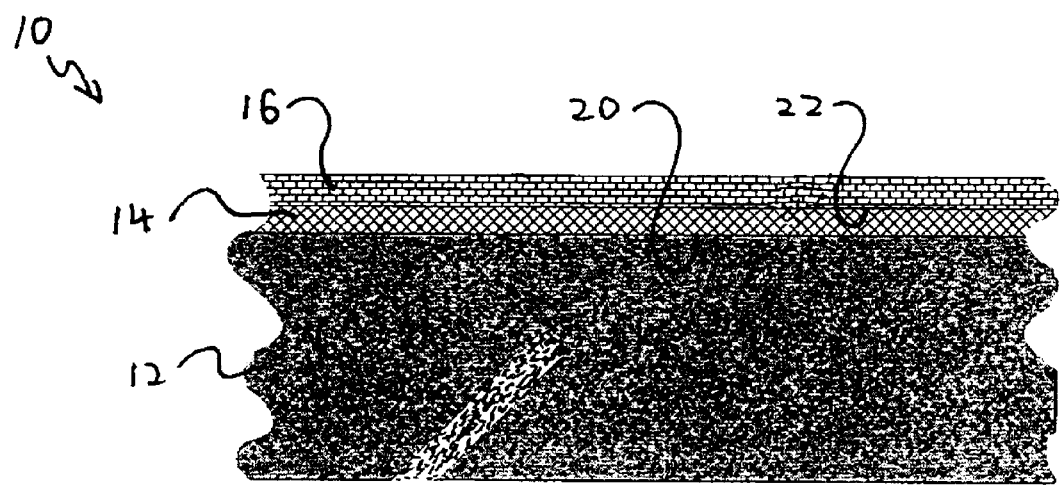
FIG. 1 is a partial cross section view of an entire wafer of semiconductor on insulator showing the placement of the insulating ceramic layer.

Referring to FIG. 1, the present invention provides a semiconductor on insulator device 10, having a substrate 12, an insulating layer 14 deposited on the substrate 12, and a semiconductor layer 16 deposited on the insulating layer 14, wherein the insulator layer 14 is formed by a polymer precursor to ceramic (PPTC)

As used herein, the term "polymer precursor to ceramic" refers to the use of organo-metallic polymer precursors that can be used to make ceramics, as that term is understood in the art. In a preferred embodiment, the term "polymer precursor to ceramic" refers to polymers described in U.S. Pat. No. 5,516,884, expressly incorporated herein by reference. These polymers are in liquid form and are represented by the formula $$[CR]_n$$ 

where R is the same or different and is selected from the group consisting of hydrogen, a saturated linear or branched-chain hydrocarbon containing 1–30 carbon atoms, and an unsaturated ring hydrocarbon containing 5 to 14 carbon atoms in the ring, each in unsubstituted or substituted form. R can also be a Group 13 through Group 16 element. The lower limit for n is about 8. Where substituted, the substituent groups can be a nitro, cyano, alkoxy, carboxy, aryl, hydroxy, heterocyclic alkyl, or heterocyclic aryl groups; a Group 13 through Group 16 element. The polymer comprises tetrahedrally hybridized carbon atoms linked to each other by three carbon-carbon single bonds into a three-dimensional continuous random network backbone, with one R group linked to each of said carbon atoms.

The term "polymer precursor to ceramic" thus embraces both silicon and non-silicon based polymer precursors which, when heated at the appropriate temperature, are converted to a ceramic material, as that term is understood in the art. Examples of preferred polymers of the above formula include $[SiC]_n$ where n is greater than 20 and $[CH]_n$ where n is greater than 8.

Some preferred polymer precursors to ceramic may also have the following formula:

$$(CH)_n(X)_m$$ 

wherein CH comprises tetrahedrally hybridized carbon atoms linked to each other by three carbon-carbon single bonds into a three-dimensional continuous random network backbone, n is between about 8 to 2,000,000, X is selected from the group consisting of chlorine, bromine, fluorine, and iodine, and m is about 0 to 10,000. The PPTC's having the formula $(CH)_n(X)_m$ are therefore a subset of the PPTC's having the formula $[CR]_n$. A particularly preferred embodiment includes chlorine as the "X" within the formula, which is believed to result in conversion of the PPTC to a ceramic at a lower temperature than would otherwise be possible.

Other preferred polymer precursors to ceramic may have the formula $$[AR]_n$$ 

which is also described within a co-pending patent application to Joray and Bianconi, filed Mar. 25, 2003, expressly incorporated herein by reference. Within this formula, n is at least 20, A is selected from the group consisting of a carbon atom, or a compound of Groups 13 through 16, with Groups 13, 15, or 16 being more preferred, a lanthanide element, a transition metal, and combinations thereof, R is the same as A or different, and is selected from the group consisting of hydrogen atoms, saturated linear or branched-chain hydrocarbons containing from about 1 to 30 carbon atoms, unsaturated ring-containing or ring hydrocarbons containing from about 5 to 14 carbon atoms in the ring, polymer chain groups having at least 20 recurring structural units, Group 13, 15, or 16 elements and compounds thereof, lanthanide elements, organic groups or polymers containing one or more heteroatoms of N, O, or S, Group 13, 15, or 16 elements, lanthanide elements, transition metals and combinations thereof, and R can be the same or different within each recurring structural unit. Preferably, the molecular weight of the polymer is at least 10,000 daltons, with 50,000 daltons, 100,000 daltons, 500,000 daltons, or 1,000,000 daltons each being increasingly preferred.

Each atom of the polymer backbone of the polymer precursor to ceramic may be is tetrahedrally-hybridized and bound via single bonds to either three other backbone atoms and one substituent, or four other backbone atoms.

Within the above formula, n is preferably greater than 1,500, and more preferably will be greater than 50,000, 100,000, 500,000, or 800,000.

A more preferred alternative to the above embodiment has the formula:

which is also described within a co-pending patent application to Joray and Bianconi, filed Mar. 25, 2003, expressly incorporated herein by reference. Within this formula, n is at least 20, A is selected from the group consisting of a carbon atom, or a compound of Groups 13 through 16, with Groups 13, 15, or 16 being more preferred, a lanthanide element, a transition metal, and combinations thereof, R is the same as A or different, and is selected from the group consisting of hydrogen atoms, saturated linear or branched-chain hydrocarbons containing from about 1 to 30 carbon atoms, unsaturated ring-containing or ring hydrocarbons containing from about 5 to 14 carbon atoms in the ring, polymer chain groups having at least 20 recurring structural units, Group 13, 15, or 16 elements and compounds thereof, lanthanide elements, organic groups or polymers containing one or more heteroatoms of N, O, or S, Group 13, 15, or 16 elements, lanthanide elements, transition metals and combinations thereof, and R can be the same or different within each recurring structural unit. Also within this formula, X is a halogen and m is about 0 to 10,000. Preferably, the molecular weight of the polymer is at least 10,000 daltons, with 50,000 daltons, 100,000 daltons, 500,000 daltons, or 1,000,000 daltons each being increasingly preferred.

Each atom of the polymer backbone of the polymer precursor to ceramic may be is tetrahedrally-hybridized and bound via single bonds to either three other backbone atoms and one substituent, or four other backbone atoms.

Within the above formula, n is preferably greater than 1,500, and more preferably will be greater than 50,000, 100,000, 500,000, or 800,000.

Figure 2:
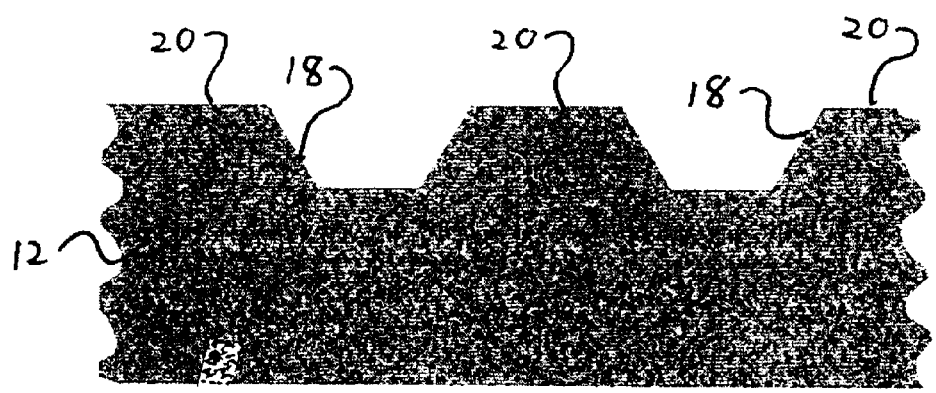
FIG. 2 is a partial cross section view of an entire wafer of semiconductor on insulator, showing region of a substrate after etching.

To produce a region with SOI properties adjacent to a bulk semiconductor region, the desired SOI region is etched back in a semiconductor substrate 12, producing the etched regions 18 in FIG. 2.

Preferred embodiments of the above formula include an embodiment wherein A is carbon, R is hydrogen, a phenyl group, a methyl group; and another embodiment wherein A is silicon, and R is a phenyl or methyl group.

In some preferred embodiments, the roughness of the PPTC may be controlled by pre-treating the surface 20 and etched regions 18 of the substrate 12. Such pre-treatments may include prewetting the surface with an appropriate solvent, such as tetrohydrofuran, seeding the surface with seed crystals, such as diamond seed crystals, or controlled roughening of the bottom surface, such as abrading the surface with a lapping slurry.

Figure 3:
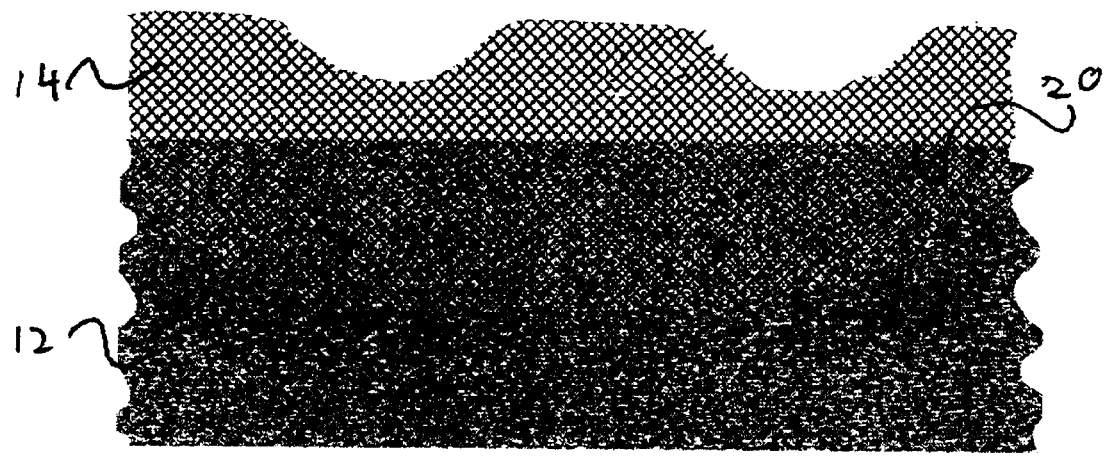
FIG. 3 is a partial cross section view of an entire wafer of semiconductor on insulator, showing region of a substrate after depositing the PPTC but before planarization.

Referring to FIG. 3, the PPTC 14 is applied to the substrate 12 in a fashion similar to photoresist application methods familiar to those skilled in the art (spin-on), but other methods, including, but not limited to, spraying, dipping or wiping the device or substrate can be used. The thickness of the insulator layer 14 can range between 150 A° to as much as 8 microns. Different spin speeds, polymer viscosities, polymer concentrations, and surface preparations can be used to obtain layers 14 of varying thicknesses. Additionally, the roughness of the converted polymer 14 can be also be controlled by controlling the spinning speed and length of spin time. For example, a higher spinning speed and longer spinning times generally correspond to smoother films. However, the higher spinning speed also generally reduces the thickness of the film, all other factors being held equal, so a compromise between the two values, as a function of spinning speed, is made.

In each case, the PPTC 14 is converted to ceramic 14 using any of several methods such as baking in an inert atmosphere, such as an argon atmosphere, or in air, at temperatures ranging from about 120° C. to about 1000° C. for time periods from 5 min to 60 hours. Preferably, the baking is carried out a temperature of about 300° C.–600° C., more preferably 350° to 450° C., for about 1–2 hours, with 2 hours being particularly preferred. Other methods such as exposure to radiation, such as IR or UV radiation, exposure to a plasma, such as a hydrogen plasma, or baking under an active atmosphere are also suitable. The polymer precursor 14 can be converted to different ceramics, such as SiC, SiN, or diamond-like carbon or diamond, depending on the polymer precursor 14 used and the properties desired, without changing the intent of this present invention.

Figure 4:
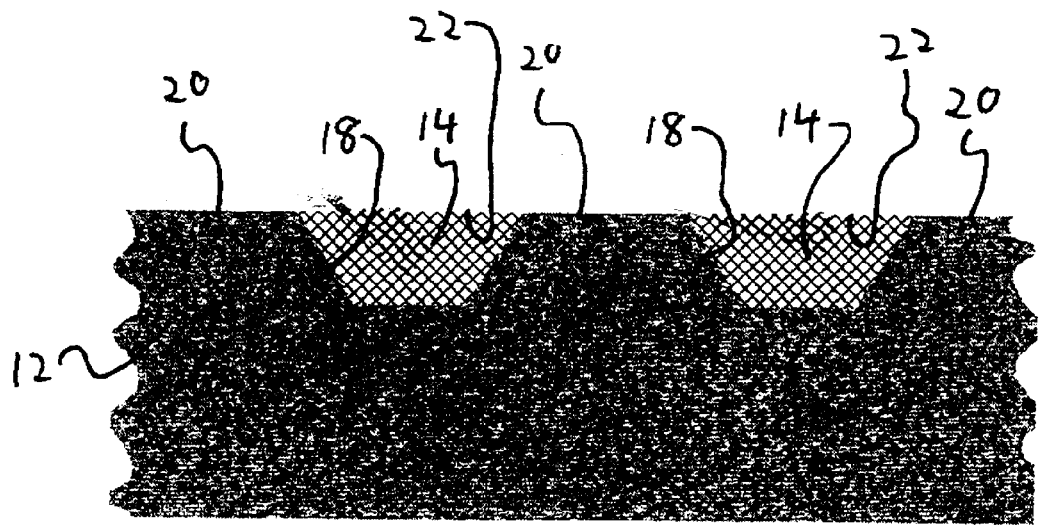
FIG. 4 is a partial cross section view of an entire wafer of semiconductor on insulator, showing region of a substrate after planarization.

If desired, the ceramic 14 can be polished using chemo-mechanical planarization (CMP) or mechanical planarization (MP) depending on the device requirements. Typically, a roughness of less than 0.5 nm $R_a$ is desirable. The result at this stage is illustrated in FIG. 4.

Figure 5:
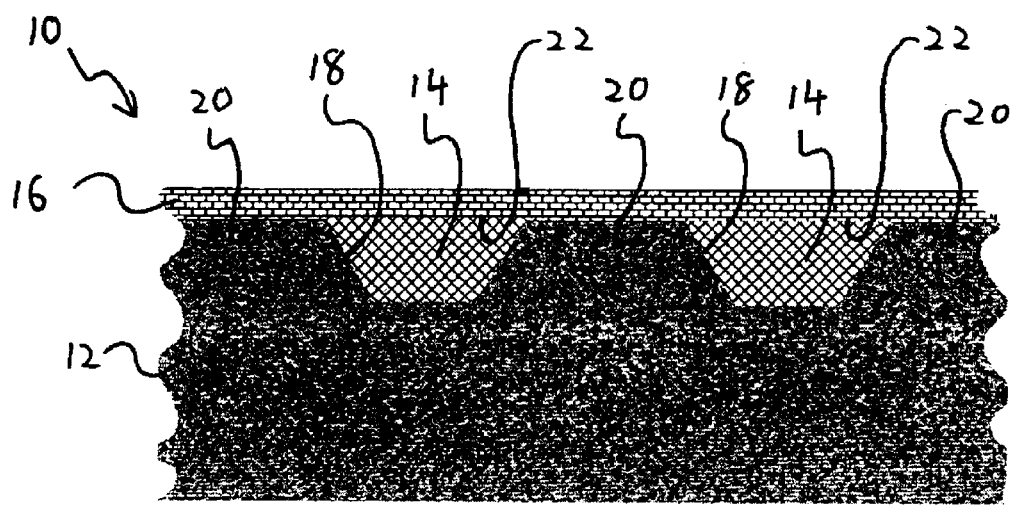
FIG. 5 is a partial cross section view of an entire wafer of semiconductor on insulator, showing region of a substrate after deposition of the semiconductor layer.

Referring to FIG. 5, the semiconductor layer 16 can then be deposited in the usual way for semiconductor on insulator structures, as is well understood by those versed in the art. For Si, for example, a polysilicon layer 16 could be deposited and recrystallized, or a semiconductor layer 16 can be grown epitaxially, or more commonly, a semiconductor wafer 16 is bonded to the insulator surface 22 and lapped back, or sliced back, or a combination of the two to the desired thickness.

The resulting device 10 may include various semiconductor components such as diodes, transistors, or various combinations thereof. One skilled in the art of semiconductor manufacture would understand how to form the semiconductor on insulator device 10 by combining silicon doped with boron (P-type silicon) and silicon doped with phosphorous (N-type silicon) to produce diodes (N-type silicon adjacent to P-type silicon), PNP transistors (alternating sections of P-type silicon, N-type silicon, and P-type silicon, with a conductor atop the N-type silicon), and NPN transistors (alternating sections of N-type silicon, P-type silicon, and N-type silicon, with a conductor atop the P-type silicon). The document entitled "SOI Technology: IBM's Next Advance in Chip Design" is expressly incorporated herein by reference.

The device 10 has the advantage of having an insulator layer 14 having increased thermal conductivity as compared to presently available insulating layers. The thermal conductivity of the material is dependent on the polymer and the conversion method used. Typical values range from about 100 W/m° K up to 2000 W/m° K. In the preferred embodiment, thermal conductivities greater than about 800 W/m° K are used. This is as compared to conventional materials, such as silicon dioxide, which has a thermal conductivity in the range of 1–2 W/m° K, typically 1.4 W/m° K. The device 10 further has the advantage of having reduced area junction capacitance. Lastly, the method of manufacture has the advantage of requiring a lower temperature for conversion of the PPTC to ceramic.

While a specific embodiment of the invention has been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A semiconductor on insulator substrate, comprising:
a semiconductor layer of silicon alloys;
an insulator layer formed of a polymer precursor to ceramic below the semiconductor layer, the polymer precursor to ceramic having the formula:

$[AR]_n$, wherein n is at least about 20,
wherein A is selected from the group consisting of carbon and silicon atoms;
R is the same as A or different, and is selected from the group consisting of hydrogen atoms, saturated linear or branched-chain hydrocarbons containing from about 1 to 30 carbon atoms, unsaturated ring-containing or ring hydrocarbons containing from about 5 to 14 carbon atoms in the ring, polymer chain groups having at least about 20 recurring structural units, Group 13 through 16 elements and compounds thereof, lanthanide elements, organic groups or polymers containing one or more heteroatoms of N, O, or S, Group 13 through Group 16 elements, lanthanide elements, and R can be the same or different within each recurring structural unit,
the molecular weight of the polymer is at least about 10,000 daltons;
the insulator layer has a thermal conductivity of at least about 100 J/m° K; and
a substrate layer below the insulator layer.

2. The semiconductor on insulator substrate of claim 1, wherein A comprises about 100% carbon.

3. The semiconductor on insulator substrate of claim 1, wherein A comprises about 100% silicon.

4. The semiconductor on insulator substrate of claim 1, wherein A comprises about 50% carbon and about 50% silicon.

5. The semiconductor on insulator substrate of claim 1, wherein the molecular weight of the polymer is at least about 50,000 daltons.

6. The semiconductor on insulator substrate of claim 1, wherein the molecular weight of the polymer is at least about 100,000 daltons.

7. The semiconductor on insulator substrate of claim 1, wherein the molecular weight of the polymer is at least about 500,000 daltons.

8. The semiconductor on insulator substrate of claim 1, wherein the molecular weight of the polymer is at least about 1,000,000 daltons.

9. The semiconductor on insulator substrate of claim 1, wherein each atom of the polymer backbone is tetrahedrally-hybridized and bound via single bonds to either three other backbone atoms and one substituent, or four other backbone atoms.

10. The semiconductor on insulator substrate of claim 1, wherein n is greater than about 1,500.

11. The semiconductor on insulator substrate of claim 1, wherein n is greater than about 50,000.

12. The semiconductor on insulator substrate of claim 1, wherein n is greater than about 100,000.

13. The semiconductor on insulator substrate of claim 1, wherein n is greater than about 500,000.

14. The semiconductor on insulator substrate of claim 1, wherein n is greater than about 800,000.

15. The semiconductor on insulator substrate of claim 1, wherein R is a single substituent.

16. The semiconductor on insulator substrate of claim 1, wherein R is a mixture of different substituents.

17. The semiconductor on insulator substrate of claim 1, having recurring units of the formula $[CH]_n$, where n is at least 20, and the molecular weight of the polymer is at least about 10,000 daltons.

18. The semiconductor on insulator substrate of claim 17, wherein the molecular weight of the polymer is at least about 50,000 daltons.

19. The semiconductor on insulator substrate of claim 17, wherein the molecular weight of the polymer is at least about 100,000 daltons.

20. The semiconductor on insulator substrate of claim 17, wherein the molecular weight of the polymer is at least about 500,000 daltons.

21. A semiconductor on insulator substrate, comprising:
a semiconductor layer of silicon alloys;
an insulator layer formed of a polymer precursor to ceramic below the semiconductor layer, the polymer precursor to ceramic having the formula:

$[AR]_n [X]_m$ wherein n is at least about 20,
wherein m is about 0 to 10,000,
X is a halogen,
wherein A is selected from the group consisting of carbon, silicon, germanium, Group 13 through Group 16 elements and compounds thereof, lanthanide elements, and combinations thereof,
R is the same as A or different, and is selected from the group consisting of hydrogen atoms, saturated linear or branched-chain hydrocarbons containing from about 1 to 30 carbon atoms, unsaturated ring-containing or ring hydrocarbons containing from about 5 to 14 carbon atoms in the ring, polymer chain groups having at least 20 recurring structural units, Group 13 through 16 elements and compounds thereof, lanthanide elements, organic groups or polymers containing one or more heteroatoms of N, O, or S, halogens, Group 13 through Group 16 elements, lanthanide elements, and R can be the same or different within each recurring structural unit,
the molecular weight of the polymer is at least about 10,000 daltons;
the insulator layer has a thermal conductivity of at least about 100 J/m° K; and
a substrate layer below the insulator layer.

22. The polymer precursor to ceramic of claim 21, wherein A comprises about 100% carbon.

23. The semiconductor on insulator substrate of claim 21, wherein A comprises about 100% silicon.

24. The semiconductor on insulator substrate of claim 21, wherein A comprises about 50% carbon and about 50% silicon.

25. The semiconductor on insulator substrate of claim 21, wherein the molecular weight of the polymer is at least 50,000 daltons.

26. The semiconductor on insulator substrate of claim 21, wherein the molecular weight of the polymer is at least about 100,000 daltons.

27. The semiconductor on insulator substrate of claim 21, wherein the molecular weight of the polymer is at least about 500,000 daltons.

28. The semiconductor on insulator substrate of claim 21, wherein the molecular weight of the polymer is at least about 1,000,000 daltons.

29. The semiconductor on insulator substrate of claim 21, wherein each atom of the polymer backbone is tetrahedrally-hybridized and bound via single bonds to either three other backbone atoms and one substituent, or four other backbone atoms.

30. The semiconductor on insulator substrate of claim 21, wherein n is greater than about 1,500.

31. The semiconductor on insulator substrate of claim 21, wherein n is greater than about 50,000.

32. The semiconductor on insulator substrate of claim 21, wherein n is greater than about 100,000.

33. The semiconductor on insulator substrate of claim 21, wherein n is greater than about 500,000.

34. The semiconductor on insulator substrate of claim 21, wherein n is greater than about 800,000.

35. The semiconductor on insulator substrate of claim 21, wherein R is a single substituent.

36. The semiconductor on insulator substrate of claim 21, wherein R is a mixture of different substituents.

37. The semiconductor on insulator substrate of claim 21, having recurring units of the formula $[CH]_n[X]_m$, where n is at least 20 and m is from about 0 to 10,000, and the molecular weight of the polymer is at least 10,000 daltons.

38. The semiconductor on insulator substrate of claim 37, wherein the molecular weight of the polymer is at least about 50,000 daltons.

39. The semiconductor on insulator substrate of claim 37, wherein the molecular weight of the polymer is at least about 100,000 daltons.

40. The semiconductor on insulator substrate of claim 37, wherein the molecular weight of the polymer is at least about 500,000 daltons.

41. The semiconductor on insulator substrate of claim 37, wherein X is chlorine.

42. The semiconductor on insulator substrate according to claim 1, wherein the substrate includes electronic devices selected from the group consisting of diodes and transistors.

43. The semiconductor on insulator substrate according to claim 1, wherein the substrate layer is silicon.

44. The semiconductor on insulator layer according to claim 1, wherein the insulator layer has a surface roughness below about 0.5 nm $R_a$.

45. The semiconductor on insulator substrate according to claim 1, wherein the insulator layer has a thermal conductivity of at least about 800 J/m° K.

46. The semiconductor on insulator substrate according to claim 1, wherein the insulator layer has a thickness of about 150 A° to 8 microns.

47. A method of manufacturing a semiconductor on insulator substrate, comprising:
providing a substrate layer;
providing an insulator layer of a semiconductor on insulator substrate on the substrate layer, the insulator layer having the formula:

$[CR]_n$ wherein the polymer comprises tetrahedrally hybridized carbon atoms linked to each other by three carbon-carbon single bonds into a three-dimensional continuous random network backbone, and one R linked to each of the carbon atoms, wherein R is the same or different and selected from the group consisting of H, a saturated linear or branched-chain hydrocarbon containing from 1 to 30 carbon atoms, an unsaturated ring hydrocarbon containing 5 to 14 carbon atoms in the ring, each in unsubstituted or substituted form; wherein the substituent groups are at least one of halogen, nitro, cyano, alkoxy, carboxy, aryl, hydroxy, heterocyclic alkyl, or heterocyclic aryl groups; a halogen, a Group 4 metal, and a Group 13 through Group 16 element, and n is at least 8;

the insulator layer has a thermal conductivity of at least about 100 J/m° K; and providing a semiconductor layer on the insulator layer.

48. The method according to claim 47, wherein the insulator layer is provided by a process selected from the group consisting of spinning, spraying, dipping, and wiping.

49. The method according to claim 47, further comprising converting the insulator layer to ceramic.

50. The method according to claim 47, wherein conversion of the insulator layer to ceramic occurs by a method selected from the group consisting of baking in an inert atmosphere, exposure of the insulator layer to radiation, exposure of the insulator layer to a plasma, or baking under an active atmosphere.

51. The method according to claim 50, wherein baking is performed from about 5 minutes to 60 hours.

52. The method according to claim 51, wherein baking is performed for about 1 to 2 hours.

53. The method according to claim 49, wherein baking is performed at a temperature of about 300° C. to 600° C.

54. The method according to claim 53, wherein baking is performed at a temperature of about 350° C. to 450° C.

55. The method according to claim 49, wherein the inert atmosphere is argon.

56. The method according to claim 49, wherein the radiation is selected from the group consisting of infrared and ultraviolet.

57. The method according to claim 49, wherein the plasma is a hydrogen plasma.

58. The method according to claim 47, further comprising limiting the surface roughness to below about 0.5 nm $R_a$ by a method selected from the group consisting of polishing, controlling the spinning speed, controlling the spin time, prewetting the surface with a solvent, seeding the substrate surface with seed crystals, and roughening of the substrate surface.

59. The method according to claim 58, wherein polishing is performed by a method selected from the group consisting of chemical-mechanical planarization and mechanical planarization.

60. The method according to claim 58, wherein the solvent is selected from the group consisting of tetrohydrofuran, ethers, ketones, or medium polarity solvents.

61. The method according to claim 58, wherein the seed crystals are diamond seed crystals.

62. The method according to claim 58, wherein roughening the substrate surface is performed by abrading the surface with a lapping slurry.

63. The method according to claim 47, further comprising etching portions of the substrate prior to depositing the insulator layer on the substrate.

64. The semiconductor on insulator substrate according to claim 1, wherein the area junction capacitance between the semiconductor layer and the substrate is less than one-half the area junction capacitance of the same device built without an SOI layer.

* * * * *